United States Patent
Lai et al.

(10) Patent No.: US 12,374,829 B2
(45) Date of Patent: Jul. 29, 2025

(54) CIRCUIT BOARD MODULE AND RELEASE COMPONENT

(71) Applicant: GIGA-BYTE TECHNOLOGY CO., LTD., New Taipei (TW)

(72) Inventors: Chih-Ming Lai, New Taipei (TW); Yung-Shun Kao, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 454 days.

(21) Appl. No.: 17/965,785

(22) Filed: Oct. 14, 2022

(65) Prior Publication Data

US 2023/0178935 A1    Jun. 8, 2023

(30) Foreign Application Priority Data

Dec. 8, 2021   (TW) ................................ 110145767
Sep. 2, 2022   (TW) ................................ 111133307

(51) Int. Cl.
   *H01R 13/633*     (2006.01)
   *H01R 12/73*      (2011.01)
   *H01R 13/627*     (2006.01)

(52) U.S. Cl.
   CPC ......... *H01R 13/633* (2013.01); *H01R 12/737* (2013.01); *H01R 13/6275* (2013.01)

(58) Field of Classification Search
   CPC ............ H01R 13/633; H01R 13/62994; H01R 12/737; H01R 12/721; G06F 1/185; G06F 1/186
   USPC .................................................. 439/327, 62
   See application file for complete search history.

(56) References Cited

U.S. PATENT DOCUMENTS

| 4,159,861 A |   | 7/1979 | Anhalt |
| 5,815,377 A |   | 9/1998 | Lund et al. |
| 6,042,402 A | * | 3/2000 | Tung .................... H01R 13/633 |
|             |   |        | 439/159 |
| 6,406,309 B1 |   | 6/2002 | Ennis et al. |

(Continued)

FOREIGN PATENT DOCUMENTS

| CN | 108352660 | 7/2018 |
| EP | 2793245 | 10/2014 |

(Continued)

OTHER PUBLICATIONS

"Office Action of Taiwan Counterpart Application", issued on Mar. 20, 2023, p. 1-p. 6.

(Continued)

*Primary Examiner* — Marcus E Harcum
(74) *Attorney, Agent, or Firm* — JCIPRNET

(57) ABSTRACT

A circuit board module including a circuit board body, a connector, and a release component is provided. The connector is disposed on the circuit board body and includes a base body and a rotating button rotatably disposed on the base body. The release component is disposed on the circuit board body and includes a linking member. The linking member is movably disposed beside the rotating button and does not contact the rotating button under normal conditions. When an external force triggers the release component, the linking member is driven to contact the rotating button, so that the rotating button rotates relative to the base body. In addition, a release component is also mentioned.

13 Claims, 11 Drawing Sheets

(56) References Cited

U.S. PATENT DOCUMENTS

| | | | | |
|---|---|---|---|---|
| 7,121,836 B2* | 10/2006 | Lai | ............... | H01R 12/721 439/59 |
| 7,121,862 B2* | 10/2006 | Tang | ............... | H01R 12/7005 439/327 |
| 7,160,126 B1* | 1/2007 | Lai | ............... | H01R 13/639 439/327 |
| 7,850,473 B1* | 12/2010 | Ozeki | ............... | H01R 12/79 439/260 |
| 7,862,368 B1* | 1/2011 | Lai | ............... | H01R 13/6275 439/358 |
| 8,277,235 B2* | 10/2012 | Lu | ............... | H01R 12/7011 439/157 |
| 8,422,216 B2 | 4/2013 | Liang et al. | | |
| 8,559,187 B2* | 10/2013 | Peng | ............... | G06F 1/185 361/801 |
| 9,017,100 B2* | 4/2015 | Lai | ............... | H01R 12/7029 439/567 |
| 9,665,134 B2* | 5/2017 | Degner | ............... | G08B 5/36 |
| 9,666,971 B1* | 5/2017 | Lai | ............... | H01R 12/721 |
| 9,935,384 B1* | 4/2018 | Li | ............... | H01R 13/6335 |
| 10,236,613 B2* | 3/2019 | Scherer | ............... | H01R 13/514 |
| 10,990,142 B2* | 4/2021 | Mao | ............... | H05K 7/1409 |
| 11,868,187 B2* | 1/2024 | Chen | ............... | G06F 1/185 |
| 2004/0121636 A1* | 6/2004 | Lai | ............... | H01R 12/7029 439/153 |
| 2005/0003692 A1* | 1/2005 | Allirot | ............... | H01R 12/7011 439/160 |
| 2008/0259582 A1 | 10/2008 | Cheng et al. | | |
| 2010/0159723 A1* | 6/2010 | Tan | ............... | H01R 12/721 439/153 |
| 2012/0322287 A1* | 12/2012 | Lu | ............... | H01R 12/7011 439/328 |
| 2014/0254086 A1 | 9/2014 | Li et al. | | |
| 2015/0131227 A1* | 5/2015 | Howell | ............... | G06F 1/185 211/26 |
| 2016/0109910 A1 | 4/2016 | Fan et al. | | |
| 2018/0090862 A1 | 3/2018 | Li et al. | | |
| 2018/0102600 A1* | 4/2018 | Lai | ............... | G06F 1/185 |
| 2020/0089288 A1* | 3/2020 | Chung | ............... | G06F 1/185 |
| 2021/0184377 A1* | 6/2021 | Dong | ............... | G06F 1/185 |
| 2022/0066519 A1* | 3/2022 | Chang | ............... | F16B 5/0635 |

FOREIGN PATENT DOCUMENTS

| | | |
|---|---|---|
| TW | M518839 | 3/2016 |
| TW | I610502 | 1/2018 |
| TW | M595343 | 5/2020 |
| TW | M610315 | 4/2021 |
| TW | M611095 | 5/2021 |

OTHER PUBLICATIONS

"Search Report of Europe Counterpart Application, Application No. 22189675.6", issued on Apr. 13, 2023, p. 1-p. 9.

"Office Action of U.S. Related Application, U.S. Appl. No. 17/694,720", issued on Sep. 13, 2023, p. 1-p. 19.

"Search Report of Europe Counterpart Application", issued on May 23, 2023, p. 1-p. 10.

* cited by examiner

CIRCUIT BOARD MODULE AND RELEASE COMPONENT

CROSS-REFERENCE TO RELATED APPLICATION

This application claims the priority benefit of Taiwan application serial no. 110145767, filed on Dec. 8, 2021, and Taiwan application serial no. 111133307, filed on Sep. 2, 2022. The entirety of each of the above-mentioned patent applications is hereby incorporated by reference herein and made a part of this specification.

BACKGROUND

Technical Field

The disclosure relates to a circuit board module and a release component, and in particular to a release component of a remote-control connector and a circuit board module including the release component.

Description of Related Art

The rotating button of the PCI-E connector is located at the end of the connector. The expansion card inserted in the PCI-E connector is lifted by pressing the rotating button. In response to the increasing size of electronic elements that disable users from pressing the rotating button, the rotating buttons on existing PCI-E connectors may be opened via a remote-control component. For example, pressing the button of the remote-control component to move the rotating button, thereby lifting the expansion card in the PCI-E connector. However, the remote-control component is vulnerable to accidental vibration caused by transportation or mis-touching that may cause the rotating button to move, resulting in electronic elements being accidentally lifted inside the PCI-E connector and affecting the operation of the circuit board.

SUMMARY

The disclosure provides a release component and a circuit board module including the release component, which prevent a connector from being accidentally opened.

The circuit board module of the disclosure includes a circuit board body, a connector, and a release component. The connector is disposed on the circuit board body and includes a base body and a rotating button rotatably disposed on the base body. The release component is disposed on the circuit board body and includes a linking member. The linking member is movably disposed beside the rotating button and does not contact the rotating button under normal conditions. When an external force triggers the release component, the linking member is driven to contact the rotating button, so that the rotating button rotates relative to the base body.

In an embodiment of the disclosure, the linking member includes a first section and a second section that are linked to each other. The first section is disposed beside the rotating button. The first section does not contact the rotating button under normal conditions but contacts the rotating button when triggered by an external force. The second section is away from the connector and the first section and the second section extend in different directions.

In an embodiment of the disclosure, the release component further includes a button disposed on the circuit board body and away from the connector. The button is linked to the second section and a movement direction of the button is different from a movement direction of the linking member.

In an embodiment of the disclosure, the rotating button includes a protruding post. The first section includes an elongated hole. The protruding post is located in the elongated hole.

In an embodiment of the disclosure, the elongated hole is a closed hole located inside the first section.

In an embodiment of the disclosure, the elongated hole is an open hole recessed in an edge of the first section, and the open hole faces the circuit board body.

In an embodiment of the disclosure, the elongated hole is an open hole recessed in an edge of the first section, and the open hole faces away from the circuit board body.

In an embodiment of the disclosure, the first section includes a wall arranged to form an elongated hole. The wall includes a first portion away from the second section and a second portion close to the second section. A distance between the first portion of the wall and the protruding post is less than a distance between the second portion of the wall and the protruding post.

In an embodiment of the disclosure, the first portion of the wall does not contact the protruding post under normal conditions but contacts and pulls the protruding post when triggered by the external force. The second portion of the wall does not contact the protruding post.

In an embodiment of the disclosure, the rotating button includes a rotating button body and a protruding post protruding from the rotating button body. The first section extends next to the rotating button body and does not contact the rotating button body.

In an embodiment of the disclosure, the circuit board module further includes a stand disposed on the circuit board body. The linking member is movably disposed between the stand and the circuit board body. The release component further includes an elastic member disposed between the stand and the linking member and configured to reset the linking member when the external force is released.

The release component of the disclosure is adapted to be disposed beside a connector, so that the rotating button of the connector is rotated relative to a base body. The release component includes a linking member, a button, and an elastic member. The linking member is movably disposed beside the rotating button and does not contact the rotating button under normal conditions. The button is linked to the linking member and away from the connector. A movement direction of the button is different from a movement direction of the linking member. The elastic member is abutting against the linking member. The linking member is driven to contact the rotating button when an external force triggers the button, so that the rotating button rotates relative to the base body and the elastic member is compressed. The elastic member recovers to reset the linking member when the external force is released.

In an embodiment of the disclosure, the linking member includes a first section and a second section that are linked to each other. The first section is disposed beside the rotating button. The first section does not contact the rotating button under normal conditions but contacts the rotating button when triggered by an external force. The second section is away from the connector and the first section and the second section extend in different directions.

In an embodiment of the disclosure, the rotating button includes a protruding post. The first section includes an elongated hole. The protruding post is located in the elongated hole.

In an embodiment of the disclosure, the elongated hole is a closed hole located inside the first section.

In an embodiment of the disclosure, the elongated hole is an open hole recessed in an edge of the first section.

In an embodiment of the disclosure, the first section includes a wall arranged to form an elongated hole. The wall includes a first portion away from the second section and a second portion close to the second section. A distance between the first portion of the wall and the protruding post is less than a distance between the second portion of the wall and the protruding post.

In an embodiment of the disclosure, the first portion of the wall does not contact the protruding post under normal conditions but contacts and pulls the protruding post when triggered by the external force. The second portion of the wall does not contact the protruding post.

In an embodiment of the disclosure, the rotating button includes a rotating button body and a protruding post protruding from the rotating button body. The first section extends next to the rotating button body and does not contact the rotating button body.

Based on the above, the circuit board module of the disclosure includes a circuit board body and a release component and a connector disposed on the circuit board body. The release component is linked with the connector, and the user may remotely open the connector through the release component. The linking member of the release component does not contact the rotating button of the connector under normal conditions. When the user triggers the release component, the linking member needs to move a distance to contact the rotating button, so that the linking member may pull the rotating button and open the connector. When the release component is accidentally shaken due to transportation or mis-touching, the displacement caused by the vibration is not enough to make the linking member contact the rotating button. The linking member is unable to pull the rotating button, so the connector is kept closed. This ensures that the connector is not opened due to accidental vibration or unintentional operation, which improves the stability of the circuit board module.

DESCRIPTION OF THE EMBODIMENTS

Figure 1:
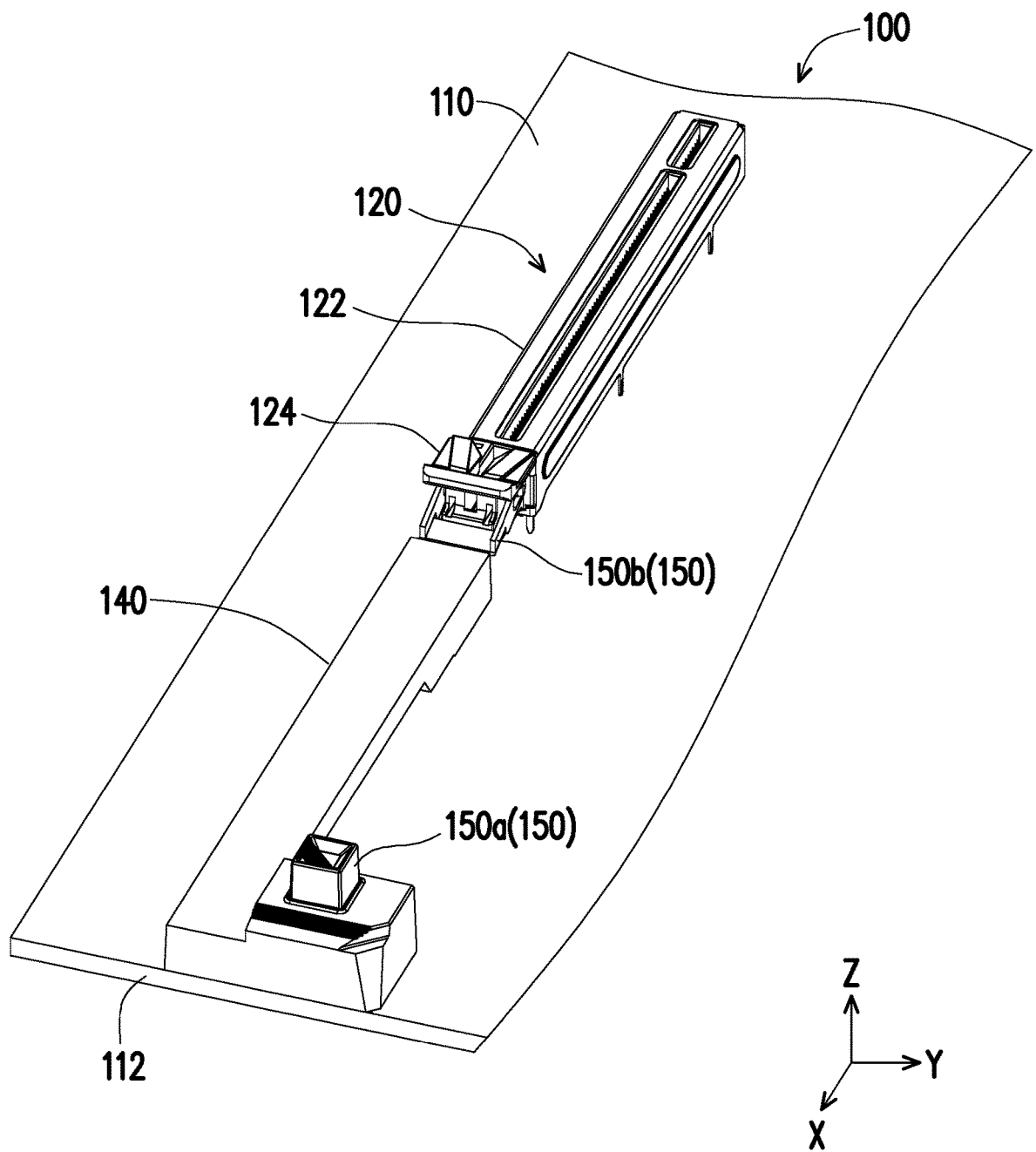
FIG. 1 is a schematic view of a circuit board module according to an embodiment of the disclosure.

FIG. 1 is a schematic view of a circuit board module according to an embodiment of the disclosure. Cartesian coordinates XYZ are also provided here to facilitate component description. Referring to FIG. 1, the circuit board module 100 of the disclosure includes a circuit board body 110, a connector 120, a release component 150, and a stand 140. The connector 120, the release component 150, and the stand 140 are disposed on the circuit board body 110. The connector 120 includes a base body 122 and a rotating button 124 rotatably disposed on the base body 122.

The connector 120 is, for example, a PCI-E connector, but not limited thereto. The connector 120 is suitable for inserting a graphic card (not shown). Since the current graphic card is usually equipped with large cooling fins and fans, the rotating button 124 is easily covered, resulting in difficulty for the user in removing the graphic card by pulling the rotating button 124 directly.

For convenience in pulling the rotating button 124 to remove the graphic card, the release component 150 includes a linking member 150*b* and a button 150*a*. The button 150*a* is linked with the rotating button 124 through the linking member 150*b*. When an external force triggers the button 150*a* of the release component 150, the linking member 150*b* is driven to contact and pull the rotating button 124, so that the rotating button 124 rotates relative to the base body 122 to open the connector 120. The button 150*a* is disposed on the circuit board body 110 and away from the connector 120. Since an edge 112 of the circuit board body 110 is less disposed with large elements, disposing the button 150*a* on the edge 112 of the circuit board body 110 may prevent the button 150*a* from being covered by other elements.

In addition, the linking member 150*b* is movably disposed between the stand 140 and the circuit board body 110. The stand 140 is disposed on the release component 150 (FIG. 2), thereby limiting the movement direction of the release component 150. The stand 140 and the release component 150 are substantially L-shaped, and the rotating button 124 and the button 150*a* are staggered in the X-axis direction, but not limited thereto. The user may change the disposition of the stand 140 and the release component 150 according to the layout of the elements on the circuit board body 110, so that the button 150*a* is located at a position that is convenient for pressing.

Figure 2:
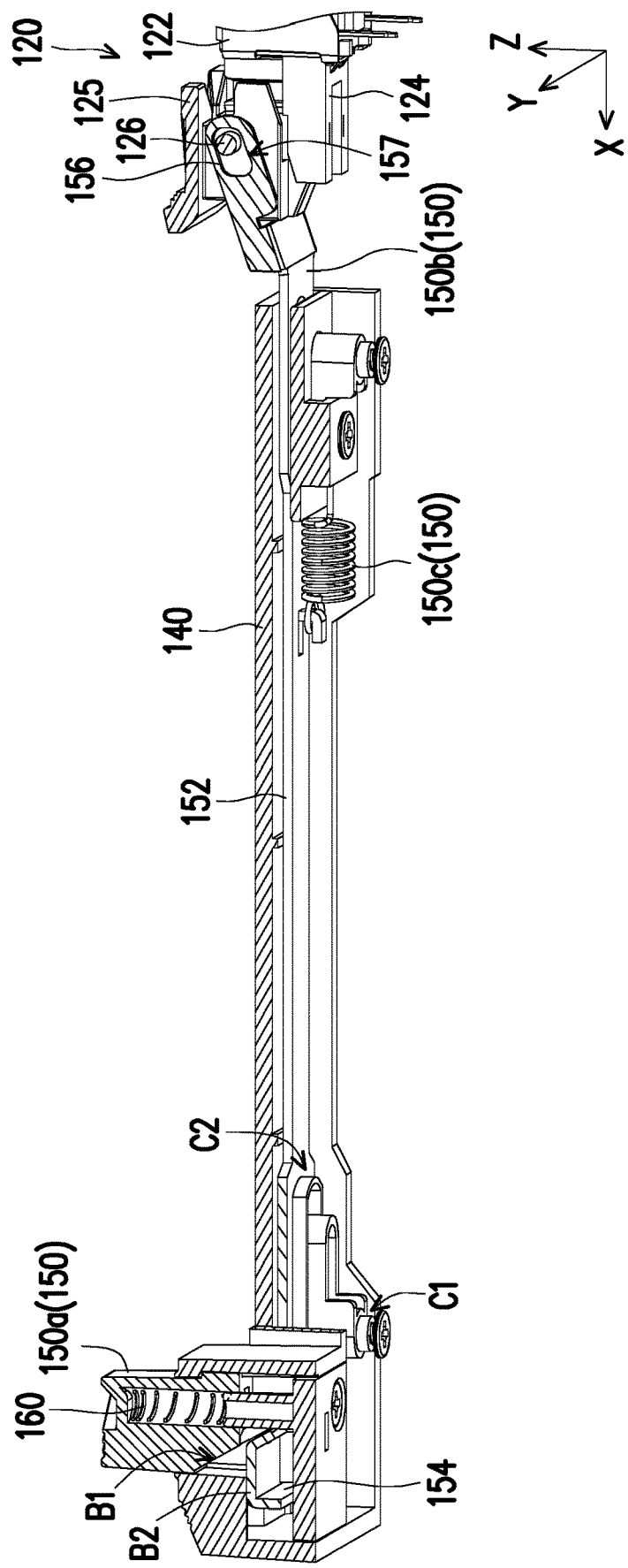
FIG. 2 is a schematic three-dimensional cross-sectional view of a stand, a release component, and a part of the connector when the button of FIG. 1 is not yet pressed.
Figure 3:
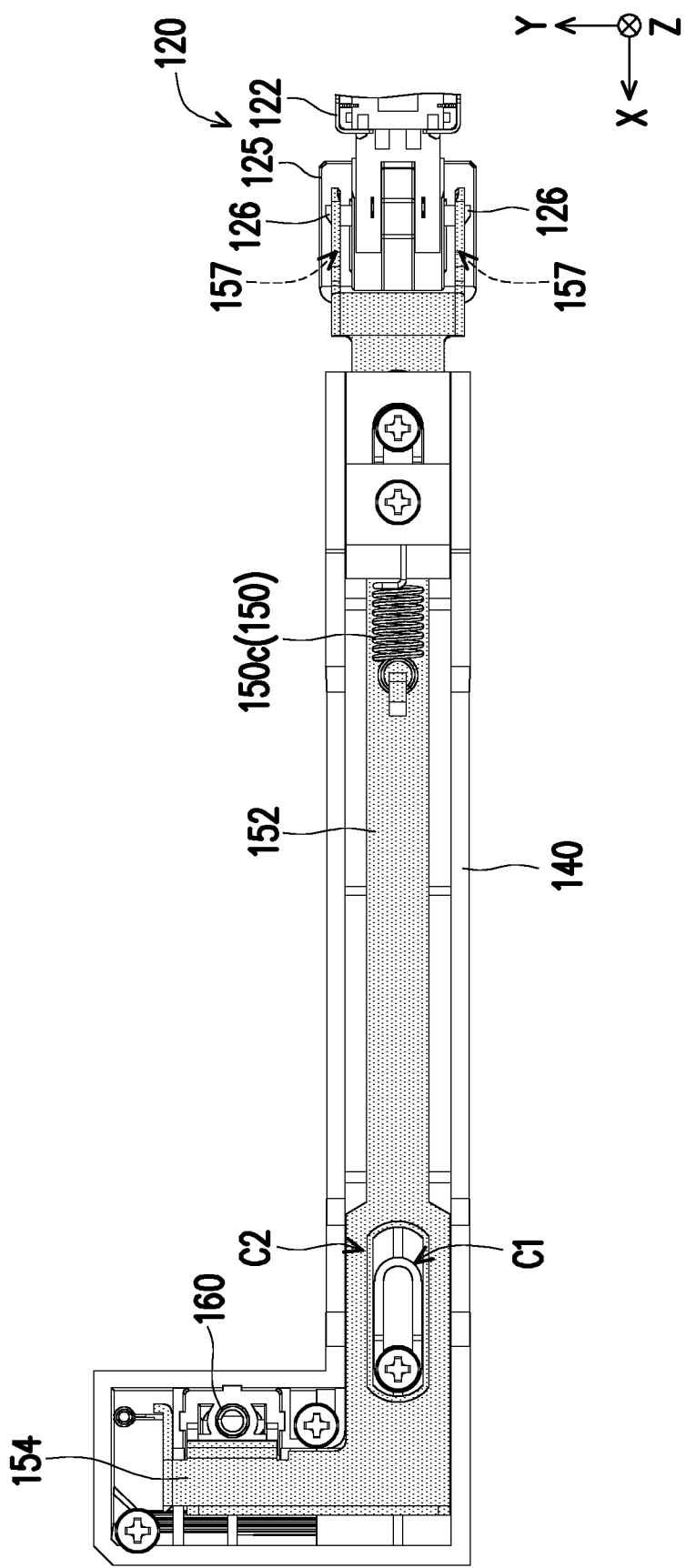
FIG. 3 is a schematic bottom view of the stand, the release component, and the part of the connector of FIG. 2.
Figure 4:
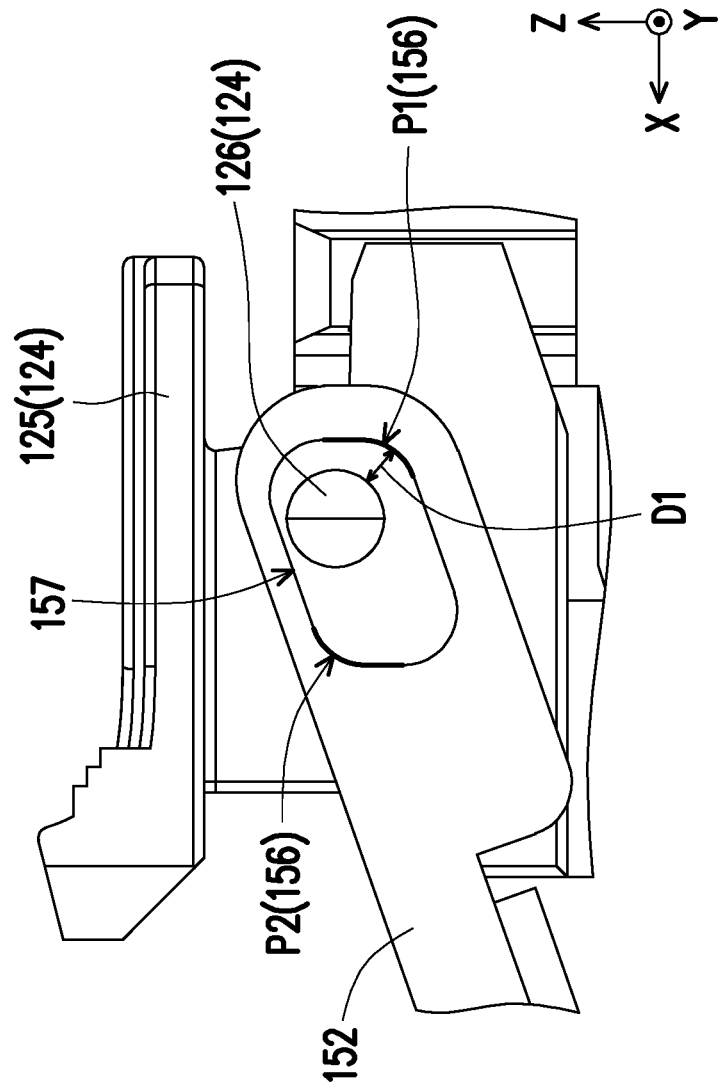
FIG. 4 is a partial side view of the rotating button and the linking member of FIG. 2.

FIG. 2 is a schematic three-dimensional cross-sectional view of a stand, a release component, and a part of the connector when the button of FIG. 1 is not yet pressed. FIG. 3 is a schematic bottom view of the stand, the release component, and the part of the connector of FIG. 2. FIG. 4 is a partial side view of the rotating button and the linking member of FIG. 2.

Referring to FIG. 2 and FIG. 4 at the same time, the linking member 150*b* is movably disposed beside the rotating button 124 and does not contact the rotating button 124 (FIG. 4) under normal conditions. The linking member 150*b* includes a first section 152 and a second section 154 that are linked to each other. The first section 152 is disposed beside the rotating button 124. The second section 154 is away from the connector 120, and the first section 152 and the second section 154 extend in different directions.

The first section 152 extends along the X-axis direction and the second section 154 extends along the Y-axis direction. The first section 152 and the second section 154 are integrally formed, but not limited thereto. For example, in other embodiments, the first section 152 may be screwed to the second section 154.

The button 150a is disposed beside the second section 154 and is linked to the second section 154. A movement direction of the button 150a is different from a movement direction of the linking member 150b. For example, the button 150a of this embodiment may move along the Z-axis direction and the linking member 150b may move along the X-axis direction. The first section 152 does not contact the rotating button 124 (FIG. 4) under normal conditions but contacts and pulls the rotating button 124 when triggered by an external force.

Specifically, as shown in FIG. 3 and FIG. 4, the rotating button 124 includes a rotating button body 125 and a protruding post 126 protruding from the rotating button body 125. The first section 152 of the linking member 150b extends next to the rotating button body 125 and does not contact the rotating button body 125 (FIG. 3). The first section 152 includes a wall 156 (FIG. 2), and the wall 156 is arranged to form an elongated hole 157. The protruding post 126 is located in the elongated hole 157.

Referring to FIG. 4, the wall 156 includes a first portion P1 away from the second section 154 and a second portion P2 close to the second section 154. A distance between the first portion P1 of the wall 156 and the protruding post 126 is less than a distance between the second portion P2 of the wall 156 and the protruding post 126. The protruding post 126 is eccentrically penetrated through the elongated hole 157. The elongated hole 157 is a closed hole located inside the first section 152, but not limited thereto.

The first portion P1 and the second portion P2 of the wall 156 do not contact the protruding post 126 under normal conditions when the button 150a is not yet pressed. Referring to FIG. 4, a distance D1 is provided between the first portion P1 of the wall 156 and the protruding post 126. When the release component 150 is accidentally shaken due to transportation or mis-touching, the small displacement caused by the vibration is not enough to make the wall 156 contact the protruding post 126 (i.e., the displacement of the wall 156 is less than the distance D1). The linking member 150b is unable to pull the rotating button 124 so that the connector 120 is kept closed. In other words, this ensures that the connector 120 is not opened due to accidental vibration or unintentional operation, which improves the stability of the circuit board module 100.

In addition, as shown in FIG. 2 and FIG. 3, the release component 150 further includes an elastic member 150c. The elastic member 150c is disposed between the stand 140 and the first section 152 of the linking member 150b. The elastic member 150c is not deformed when the button 150a is not yet pressed.

The left side of FIG. 2 shows the button 150a and a part of the second section 154 of the linking member 150b. The button 150a includes a first pushing area B1 and the first pushing area B1 is a slope. The second section 154 includes a corresponding second pushing area B2 and the second pushing area B2 is also a slope, but not limited thereto. The inclined first push area B1 is suitable for changing the movement direction.

Figure 5:
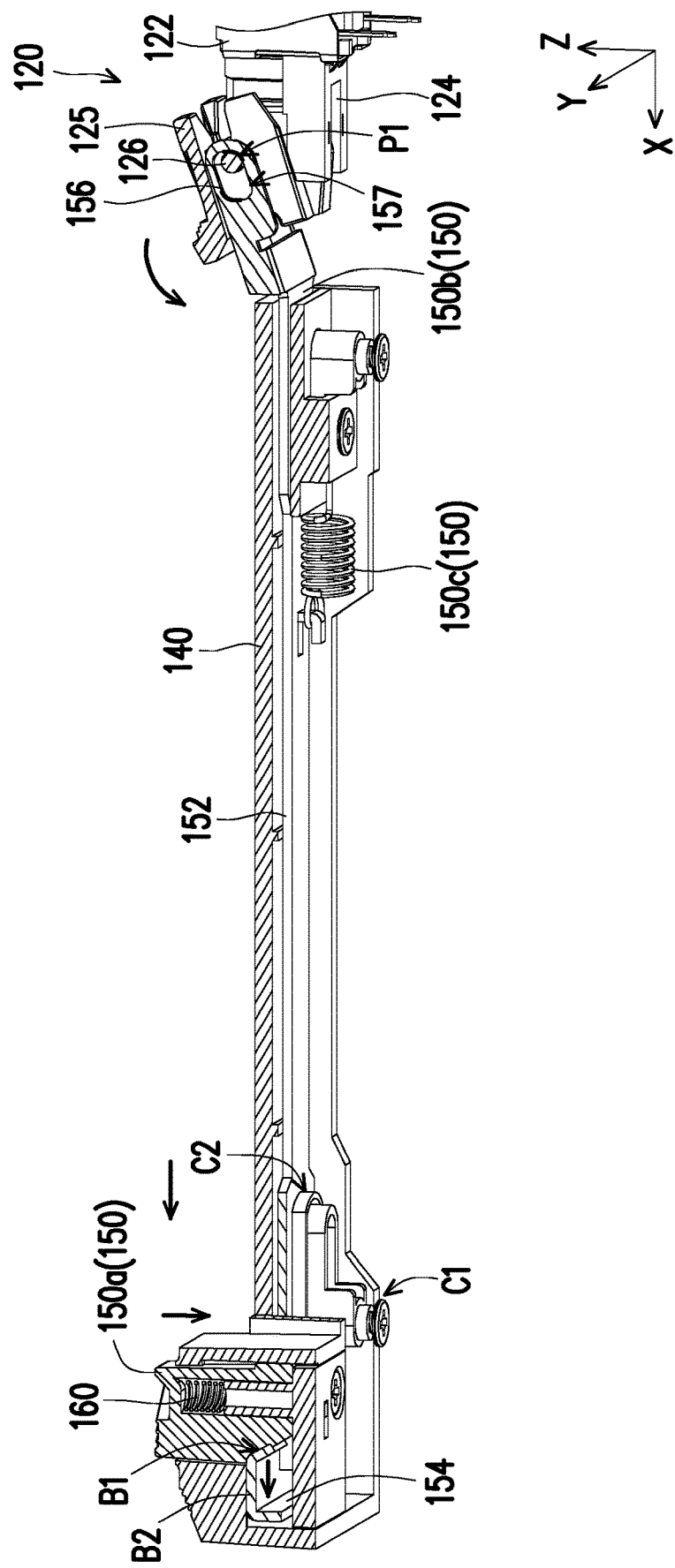
FIG. 5 is a schematic three-dimensional cross-sectional view of a stand, a release component, and a portion of the connector when the button of FIG. 1 is pressed.
Figure 6:
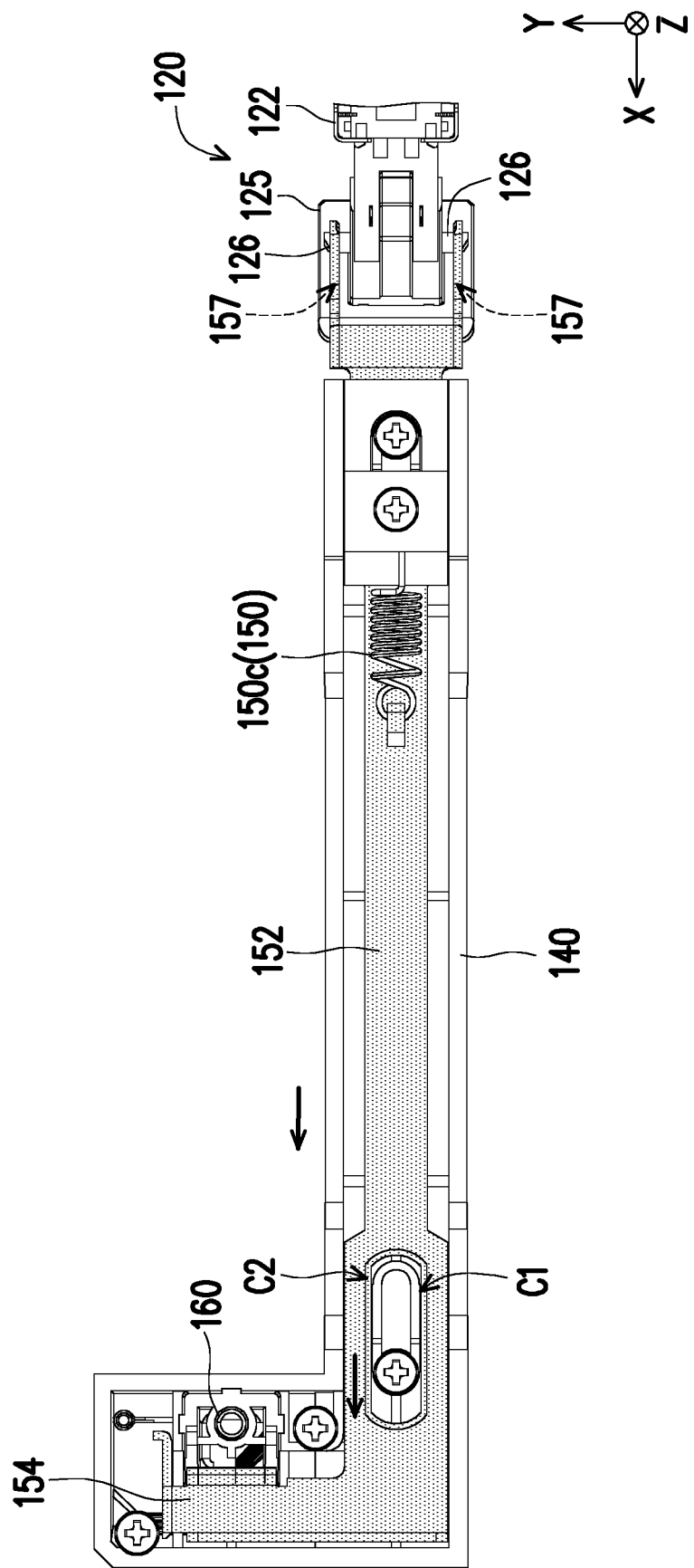
FIG. 6 is a schematic bottom view of the stand, the release component, and the part of the connector of FIG. 5.
Figure 7:
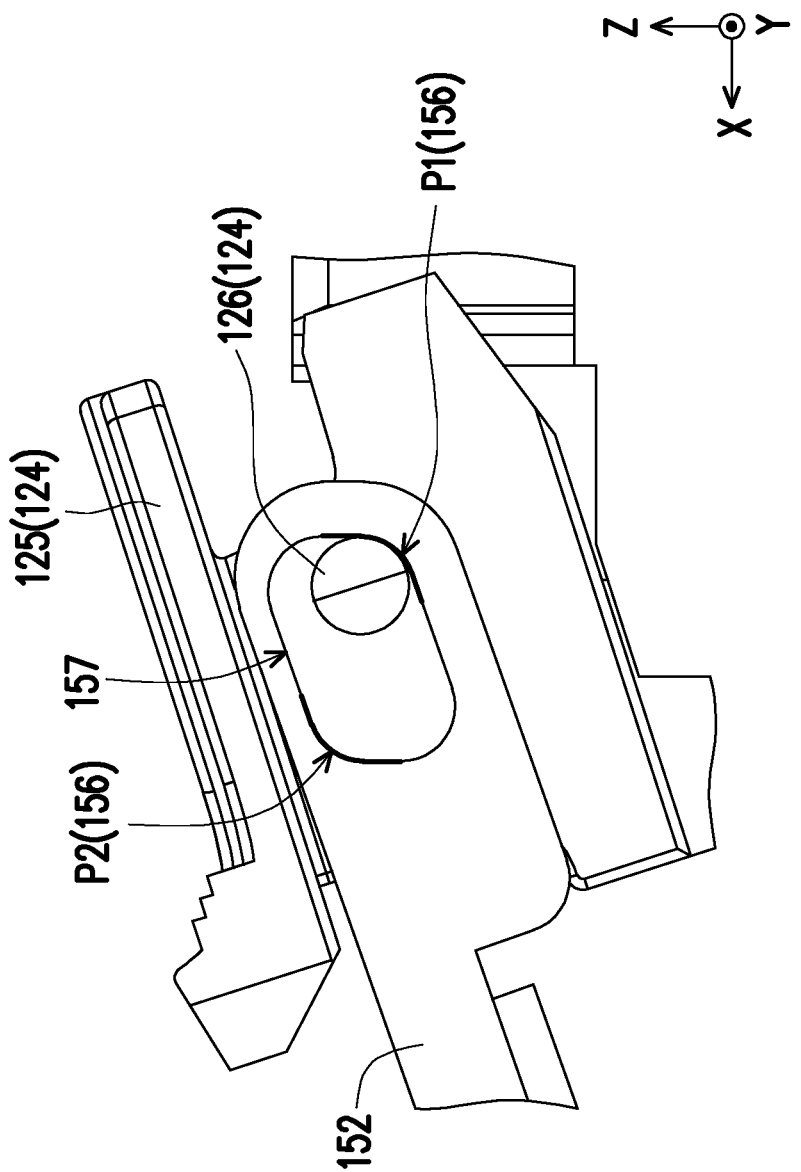
FIG. 7 is a partial side view of the rotating button and the linking member of FIG. 5.

FIG. 5 is a schematic three-dimensional cross-sectional view of a stand, a release component, and a portion of the connector when the button of FIG. 1 is pressed. FIG. 6 is a schematic bottom view of the stand, the release component, and the part of the connector of FIG. 5. FIG. 7 is a partial side view of the rotating button and the linking member of FIG. 5.

Referring to FIG. 5 to FIG. 7 at the same time, when the button 150a is pressed down along the −Z axis direction, the inclined first pushing area B1 pushes the second pushing area B2, so that the second pushing area B2 (the second section 154) is moved to the +X-axis direction. Since the first section 152 is linked with the second section 154, the first section 152 moves along the X-axis direction and pulls the rotating button 124 to rotate, and the connector 120 is opened.

Specifically, as shown in FIG. 5 and FIG. 7, the first portion P1 of the wall 156 of the first section 152 moves a distance D1 (FIG. 4) to contact and pull the protruding post 126. The protruding post 126 drives the rotating button body 125 to rotate counterclockwise relative to the base body 122 (i.e., toward the circuit board body 110 of FIG. 1). At this time, the rotating button body 125 is in an open position, and the connector 120 is in an open state. The second portion P2 of the wall 156 still does not contact the protruding post 126 (FIG. 7).

As shown in FIG. 5, when the button 150a is pressed, the movement of the first section 152 of the linking member 150b drives the elastic member 150c to deform and accumulate elastic potential energy. For preventing the linking member 150b from rotating when moving along the +X-axis direction, the stand 140 of this embodiment includes a first limiting portion C1. The linking member 150b includes a second limiting portion C2 corresponding to the first limiting portion C1.

The first limiting portion C1 is, for example, a protrusion. The second limiting portion C2 is, for example, an opening extending along the X-axis direction. The first limiting portion C1 penetrates the second limiting portion C2. When the linking member 150b moves along the X-axis direction, the first limiting portion C1 and the second limiting portion C2 cooperate with each other so that the linking member 150b may only move along the X-axis direction without rotating. In this way, the linking member 150b may drive the rotating button 124 more stably.

In addition, as shown in FIG. 3 and FIG. 6, no matter whether the button 150a is pressed or not, the first section 152 of the linking member 150b does not contact with the rotating button body 125. Therefore, there is no friction between the linking member 150b and the rotating button body 125. When the button 150a is pressed, the movement of the first section 152 is not affected by the rotating button body 125, and the effect of labor-saving may be achieved.

The circuit board module 100 of this embodiment further includes a spring 160. As shown on the left side of FIG. 5, the spring 160 is disposed between the button 150a and the stand 140. When the button 150a is pressed (FIG. 5), the spring 160 deforms and accumulates elastic potential energy. When the external force is released, the spring 160 is adapted to lift the button 150a back to the position shown in FIG. 2 (and FIG. 8).

Figure 8:
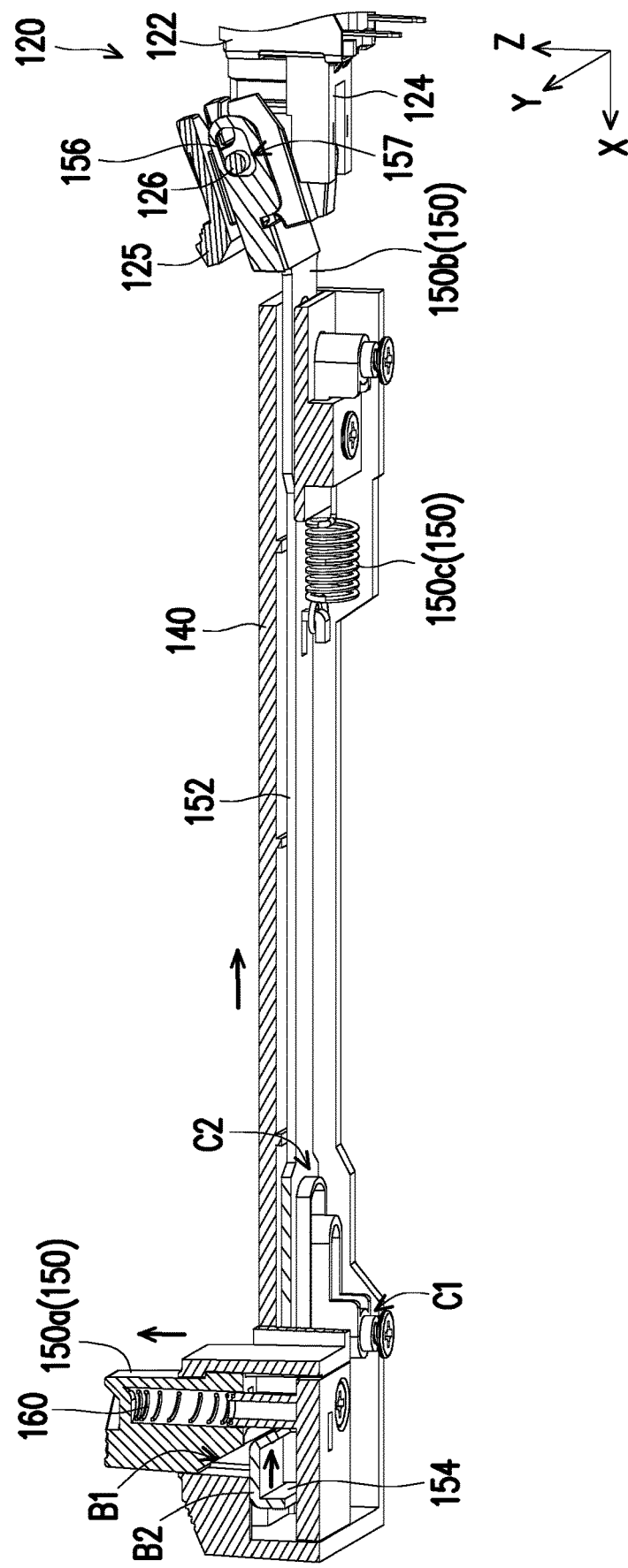
FIG. 8 is a schematic three-dimensional cross-sectional view of the stand, the release component, and the part of the connector when the external force of FIG. 5 is released.
Figure 9:
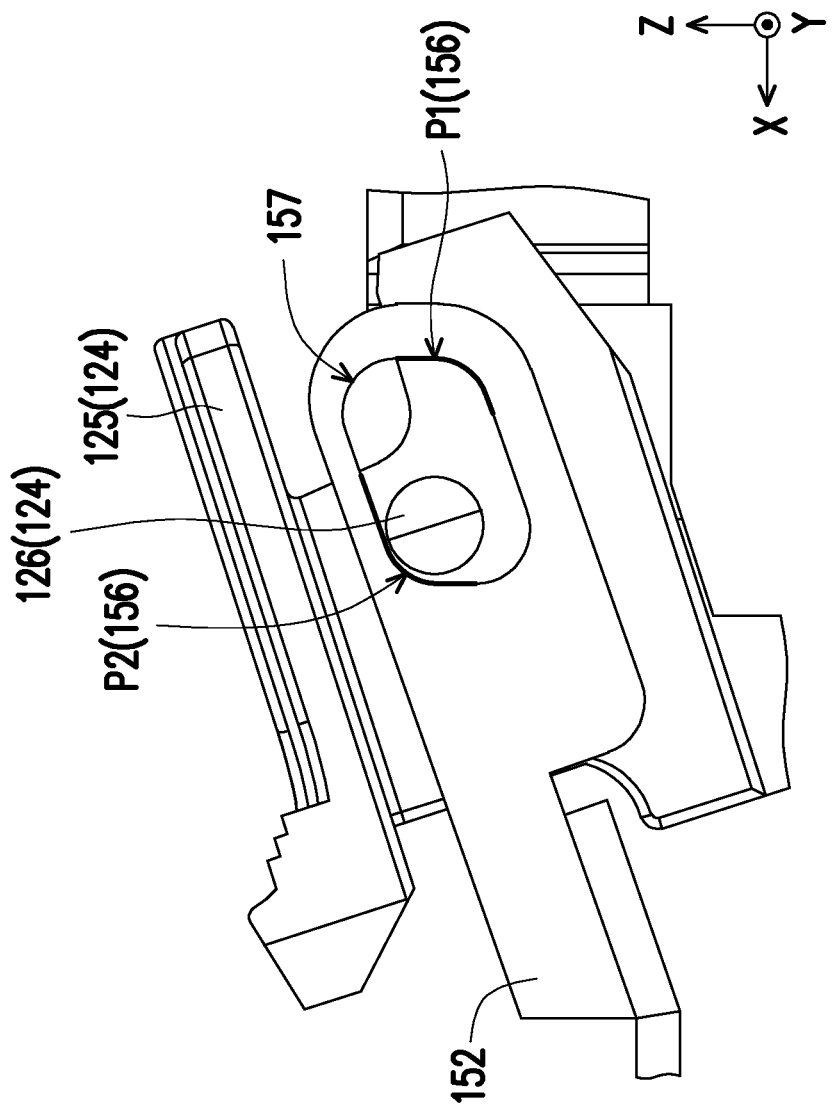
FIG. 9 is a partial side view of the rotating button and the linking member of FIG. 8.

FIG. 8 is a schematic three-dimensional cross-sectional view of the stand, the release component, and the part of the connector when the external force of FIG. 5 is released. FIG. 9 is a partial side view of the rotating button and the linking member of FIG. 8. Referring to FIG. 8 and FIG. 9 at the same time, when the external force on the button 150a of FIG. 5 is released, the button 150a may be reset back to the position shown in FIG. 8 by the elastic potential energy provided by the spring 160. At this time, the schematic bottom view of the release component 150 and the stand 140 is shown in FIG. 3, which is not repeated herein.

The first pushing area B1 of the button 150a moves away from the second pushing area B2 of the linking member 150b. The linking member 150b may be reset back to the position shown in FIG. 8 by the elastic potential energy provided by the elastic member 150c.

As shown in FIG. 9, when the linking member 150b is reset, the first portion P1 of the wall 156 moves away from the protruding post 126, the second portion P2 moves close to the protruding post 126 but does not contact the protruding post 126, and the rotating button 124 (FIG. 8) is still in the open position. In light of the above, no matter how the linking member 150b moves, the second portion P2 of the wall 156 does not contact the protruding post 126.

In this embodiment, since the second portion P2 does not contact the protruding post 126, even if the external force on the button 150a is released, the connector 120 is still in an open state for the user to insert and remove the graphic card. In other words, the user does not need to keep pressing the button 150a when inserting and removing the graphic card, which may improve the convenience of using the circuit board module 100.

In addition, when the user inserts the graphic card, the graphic card drives and resets the rotating button 124. The rotating button 124 is rotated from the open position shown in FIG. 8 back to the closed position shown in FIG. 2, at which time the connector 120 is in a closed state and may hold the graphic card firmly.

Figure 10:
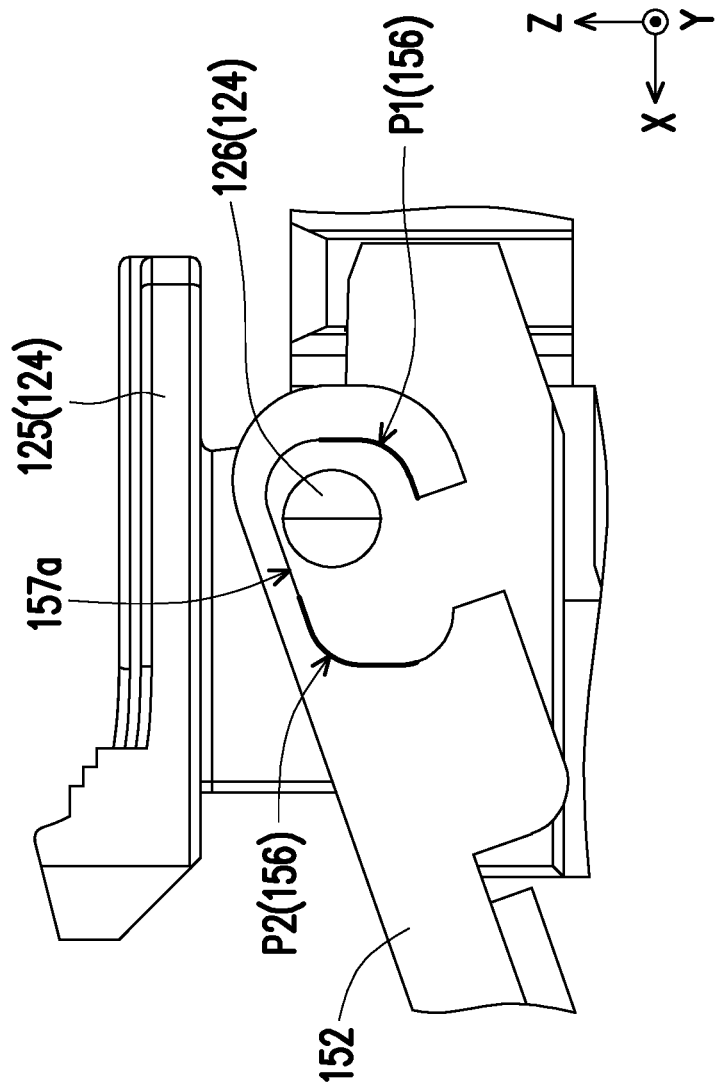
FIG. 10 is a side view of a rotating button and a linking member according to another embodiment of the disclosure.

FIG. 10 is a side view of a rotating button and a linking member according to another embodiment of the disclosure. Referring to FIG. 4 and FIG. 10 at the same time, the elongated hole 157a of this embodiment is similar to the above-mentioned embodiment, and the difference between the two is: The elongated hole 157a of this embodiment is an open hole recessed in an edge of the first section 152, and the open hole faces the circuit board body 110 shown in FIG. 1 (i.e., the C-shaped opening of the open hole is located on the lower side). The elongated hole 157a is substantially C-shaped. The elongated hole 157a of this embodiment are identical to those described in the above-mentioned embodiment. Hence, a detailed description thereof is omitted.

It is worth mentioning that the protruding post 126 may enter into the elongated hole 157a through the C-shaped opening of the elongated hole 157a, thereby improving the convenience of assembling between the linking member 150b and the connector 120. When the first section 152 of the linking member 150b moves between the positions shown in FIG. 4 and FIG. 7, the protruding post 126 does not move out of the elongated hole 157a from the C-shaped opening.

Figure 11:
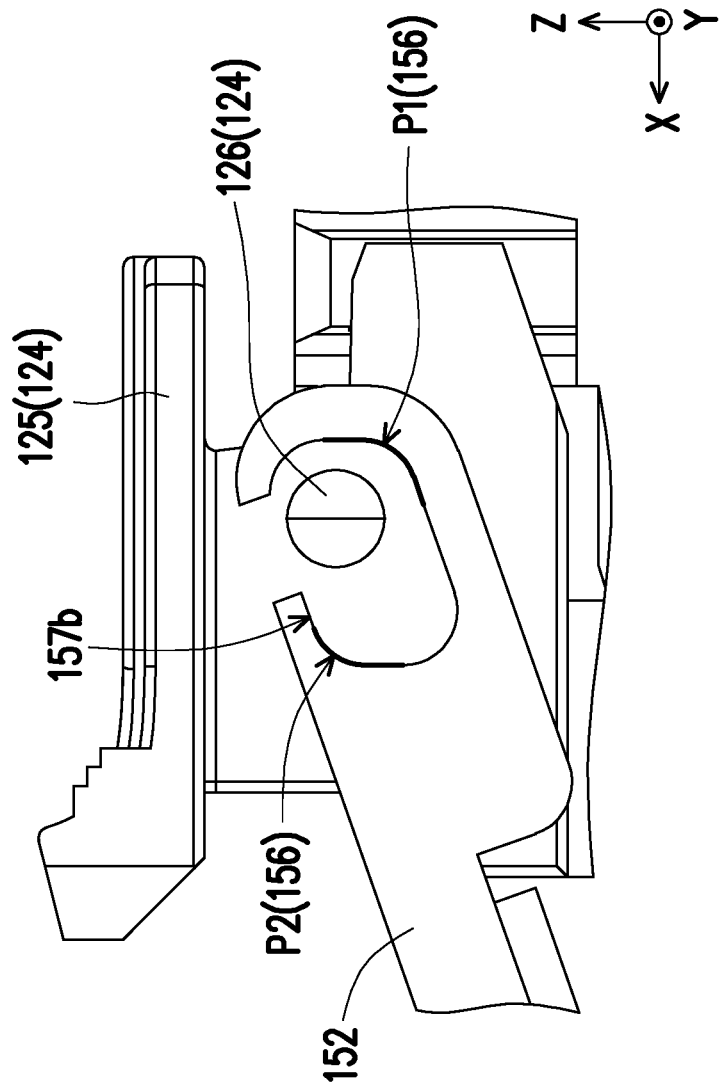
FIG. 11 is a side view of a rotating button and a linking member according to another embodiment of the disclosure.

FIG. 11 is a side view of a rotating button and a linking member according to another embodiment of the disclosure. Referring to FIG. 10 and FIG. 11 at the same time, the elongated hole 157b of this embodiment is similar to the above-mentioned embodiment, and the difference between the two is: The elongated hole 157b of this embodiment is an open hole, and open hole faces away from the circuit board body 110 shown in FIG. 1 (i.e., the C-shaped opening of the open hole is located on the upper side). The elongated hole 157b of this embodiment are identical to those described in the above-mentioned embodiment. Hence, a detailed description thereof is omitted. Users may dispose the elongated holes 157, 157a, 157b according to their needs.

To sum up, the circuit board module of the disclosure includes a circuit board body and a connector and a release component disposed on the circuit board body. The release component is linked with the connector, and the user may remotely open the connector through the release component. The linking member of the release component does not contact the protruding post of the rotating button of the connector under normal conditions. When the button of the release component is triggered by an external force, the linking member needs to move a distance to contact the protruding post, so that the linking member may pull the protruding post and open the connector. Therefore, when the release component is accidentally shaken due to transportation or mis-touching, the displacement caused by the vibration is not enough to make the linking member contact the protruding post. The linking member is unable to pull the protruding post, so the connector is kept closed. This ensures that the connector is not opened due to accidental vibration or unintentional operation, which improves the stability of the circuit board module.

In addition, the linking member does not contact the rotating button body of the rotating button, so that there is no friction between the linking member and the rotating button. Therefore, when the linking member moves relative to the rotating button, the movement of the linking member is not affected by the rotating button body, and the effect of labor-saving may be achieved.

What is claimed is:

1. A circuit board module, comprising:
   a circuit board body;
   a connector, disposed on the circuit board body and comprising a base body and a rotating button rotatably disposed on the base body; and
   a release component, disposed on the circuit board body and comprising a linking member, wherein the linking member is movably disposed beside the rotating button and does not contact the rotating button under normal conditions,
   wherein the linking member is driven to contact the rotating button when an external force triggers the release component, so that the rotating button rotates relative to the base body,
   wherein the linking member comprises a first section and a second section that are linked to each other, the first section is disposed beside the rotating button, the first section does not contact the rotating button under normal conditions but contacts the rotating button when triggered by the external force, the second section is away from the connector, and the first section and the second section extend in different directions,
   wherein the rotating button comprises a protruding post, the first section comprises an elongated hole, and the protruding post is located in the elongated hole,
   wherein the first section comprises a wall arranged to form the elongated hole, the wall comprises a first portion away from the second section and a second portion close to the second section, a distance between the first portion of the wall and the protruding post is less than a distance between the second portion of the wall and the protruding post.

2. The circuit board module according to claim 1, wherein the release component further comprises a button disposed on the circuit board body and away from the connector, the button is linked to the second section, and a movement direction of the button is different from a movement direction of the linking member.

3. The circuit board module according to claim 1, wherein the elongated hole is a closed hole located inside the first section.

4. The circuit board module according to claim 1, wherein the elongated hole is an open hole recessed in an edge of the first section, and the open hole faces the circuit board body.

5. The circuit board module according to claim 1, wherein the elongated hole is an open hole recessed in an edge of the first section, and the open hole faces away from the circuit board body.

6. The circuit board module according to claim 1, wherein the first portion of the wall does not contact the protruding post under normal conditions but contacts and pulls the protruding post when triggered by the external force, and the second portion of the wall does not contact the protruding post.

7. The circuit board module according to claim 1, wherein the rotating button comprises a rotating button body and the protruding post protruding from the rotating button body, and the first section extends next to the rotating button body and does not contact the rotating button body.

8. The circuit board module according to claim 1, further comprising a stand disposed on the circuit board body, wherein the linking member is movably disposed between the stand and the circuit board body, and the release component further comprises an elastic member disposed between the stand and the linking member and configured to reset the linking member when the external force is released.

9. A release component, adapted to be disposed beside a connector, so that a rotating button of the connector is rotated relative to a base body, the release component comprising:
  a linking member, movably disposed beside the rotating button and not contacting the rotating button under normal conditions;
  a button, linked to the linking member and away from the connector, wherein a movement direction of the button is different from a movement direction of the linking member; and
  an elastic member, abutting against the linking member, wherein the linking member is driven to contact the rotating button when an external force triggers the button, so that the rotating button rotates relative to the base body and the elastic member is compressed,
  wherein the elastic member recovers to reset the linking member when the external force is released,
  wherein the linking member comprises a first section and a second section that are linked to each other, the first section is disposed beside the rotating button, the first section does not contact the rotating button under normal conditions but contacts the rotating button when triggered by the external force, the second section is away from the connector, and the first section and the second section extend in different directions,
  wherein the rotating button comprises a protruding post, the first section comprises an elongated hole, and the protruding post is located in the elongated hole,
  wherein the first section comprises a wall arranged to form the elongated hole, the wall comprises a first portion away from the second section and a second portion close to the second section, a distance between the first portion of the wall and the protruding post is less than a distance between the second portion of the wall and the protruding post.

10. The release component according to claim 9, wherein the elongated hole is a closed hole located inside the first section.

11. The release component according to claim 9, wherein the elongated hole is an open hole recessed in an edge of the first section.

12. The release component according to claim 9, wherein the first portion of the wall does not contact the protruding post under normal conditions but contacts and pulls the protruding post when triggered by the external force, and the second portion of the wall does not contact the protruding post.

13. The release component according to claim 9, wherein the rotating button comprises a rotating button body and the protruding post protruding from the rotating button body, and the first section extends next to the rotating button body and does not contact the rotating button body.

* * * * *